May 21, 1957 H. G. WOLFF 2,793,292

CONSTANT AMPLITUDE VARIABLE FREQUENCY OSCILLATION GENERATOR

Original Filed Aug. 13, 1948 2 Sheets-Sheet 1

INVENTOR.
HUBERT G. WOLFF
BY George Sipkin
Attorney

May 21, 1957 H. G. WOLFF 2,793,292

CONSTANT AMPLITUDE VARIABLE FREQUENCY OSCILLATION GENERATOR

Original Filed Aug. 13, 1948 2 Sheets-Sheet 2

INVENTOR.
HUBERT G. WOLFF
BY George Lipkin
Attorney

United States Patent Office 2,793,292
Patented May 21, 1957

2,793,292

CONSTANT AMPLITUDE VARIABLE FREQUENCY OSCILLATION GENERATOR

Hubert G. Wolff, San Diego, Calif.

Original application August 13, 1948, Serial No. 44,212. Divided and this application September 10, 1951, Serial No. 245,957

10 Claims. (Cl. 250—36)

(Granted under Title 35, U. S. Code (1952), sec. 266)

This is a division of patent application Serial Number 44,212, filed August 13, 1948, now abandoned.

This invention relates to a method and apparatus for measuring and presenting impedance versus frequency; and more particularly, to a constant amplitude variable frequency oscillation generator or oscillator for use therewith, such apparatus employing a cathode ray oscilloscope, wherein the horizontal deflection of the scope represents frequency by being synchronized with the frequency sweeping of said variable frequency oscillator, and wherein the deflection of the vertical plates represents impedance by being energized by a rectified voltage proportional to the instantaneous value of the impedance being measured and presented.

It is an object of this invention to provide for the simple and direct presentation of impedance versus frequency for any unknown impedance.

It is object of this invention to provide an oscillation generator of variable frequency, in which the amplitude of the output may be held substantially constant.

Other objects and many of the attendant advantages of this invention will be readily appreciated as the same becomes better understood by reference to the following description.

Basically, the circuit of this invention comprises a variable frequency, constant amplitude, oscillator, the output of which is applied in series with a fixed impedance, to an unknown impedance to be observed. The magnitude of the fixed impedance is many times that of the maximum value expected of the observed impedance. Under such conditions the current flowing through the unknown impedance will be substantially constant, regardless of the value of the unknown impedance. Thus, the voltage developed across the terminals of the impedance becomes substantially a direct measure of the magnitude of the impedance itself. This voltage is rectified and amplified, and then applied to the horizontal deflection plates of an oscilloscope. The frequency of the oscillator is swept back and forth periodically by a sweep circuit which also controls the sweep voltage applied to the horizontal plates of the oscilloscope. There thus results on the oscilloscope screen a plot of impedance versus frequency, since the instantaneous horizontal position of the cathode ray spot is directly related to the oscillation frequency of the oscillator.

For proper operation of the system it is essential that the amplitude of the alternating voltage appearing at the output terminals of the oscillator be substantially constant regardless of the frequency of oscillation. To this end this invention contemplates the employment of a specially designed constant amplitude oscillator. This oscillator is characterized by the inclusion of variable impedance means connected in parallel with the tunable resonant circuit of the oscillator. The Q of the resonant circuit of the oscillator, and hence the amplitude of oscillation, is directly controlled by this variable impedance, which in turn is controlled by the oscillator output. In this way the output amplitude of the oscillator may be maintained substantially constant within a very small range of deviation. The variable impedance means is also connected to the oscillator plate, so that the variable impedance serves not only to alter the Q of the resonant circuit, but also tends to control the D. C. voltage at the plate of the oscillator, both types of control tending to stabilize the output amplitude of the oscillator.

There are many occasions when it is desirable to examine a small portion of the frequency spectrum. To this end the sweep circuit includes means for isolating any predetermined segment of the presentation, and expanding it over the entire scope sweep, so that more detailed observation may be had of the desired frequency band.

A specific embodiment of the instant invention, described generally above, will now be described in connection with the accompanying drawings, wherein.

Figure 1:
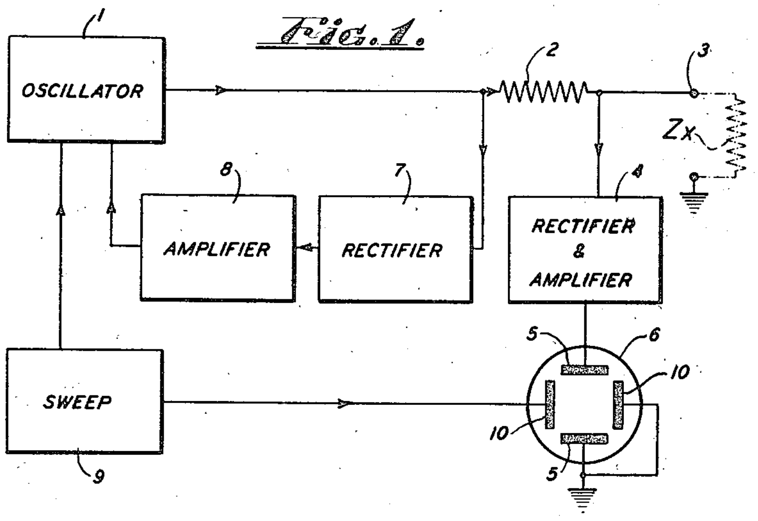
Fig. 1 is a block diagram illustrating the essential portions of the over-all system.

Referring to Fig. 1, the numeral 1 designates a constant amplitude oscillator, the output of which is fed through an impedance 2 to an output terminal 3. The terminal 3 is adapted to be connected to an impedance $Z_x$ to be observed. The impedance 2 is preferably a resistor, the magnitude of which is many times larger than that of the highest valued impedance $Z_x$ expected to be encountered. Thus the variable frequency current from the oscillator 1 through the series connected impedances 2 and $Z_x$ may be expected to be substantially constant, regardless of the value of $Z_x$. Under this premise it is readily seen that the voltage developed across $Z_x$ will be a substantially accurate measure of the magnitude of $Z_x$ itself.

To measure the voltage across $Z_x$, there is connected to the terminal 3 a rectifier and amplifier circuit 4, which serves to rectify and amplify the voltage developed across $Z_x$, and then apply it to the vertical plates 5 of an oscilloscope 6.

In order that the current through the impedances 2 and $Z_x$ should be substantially constant, regardless of the frequency of the signals from the oscillator 1, it is essential that the oscillator 1 be of substantially constant output amplitude. For this purpose, a portion of the output from the oscillator 1 is rectified at 7, amplified at 8, and returned to a control tube in the oscillator 1, to be described hereinafter, which control tube serves to control and thereby render substantially constant the amplitude of oscillation of the oscillator 1.

The frequency of the output signals from the oscillator 1 is swept back and forth by means of a sweep circuit 9, which also serves to control the horizontal plates 10 of the oscilloscope 6 in synchronism with the frequency variation or sweep applied to the oscillator 1.

Figure 2:
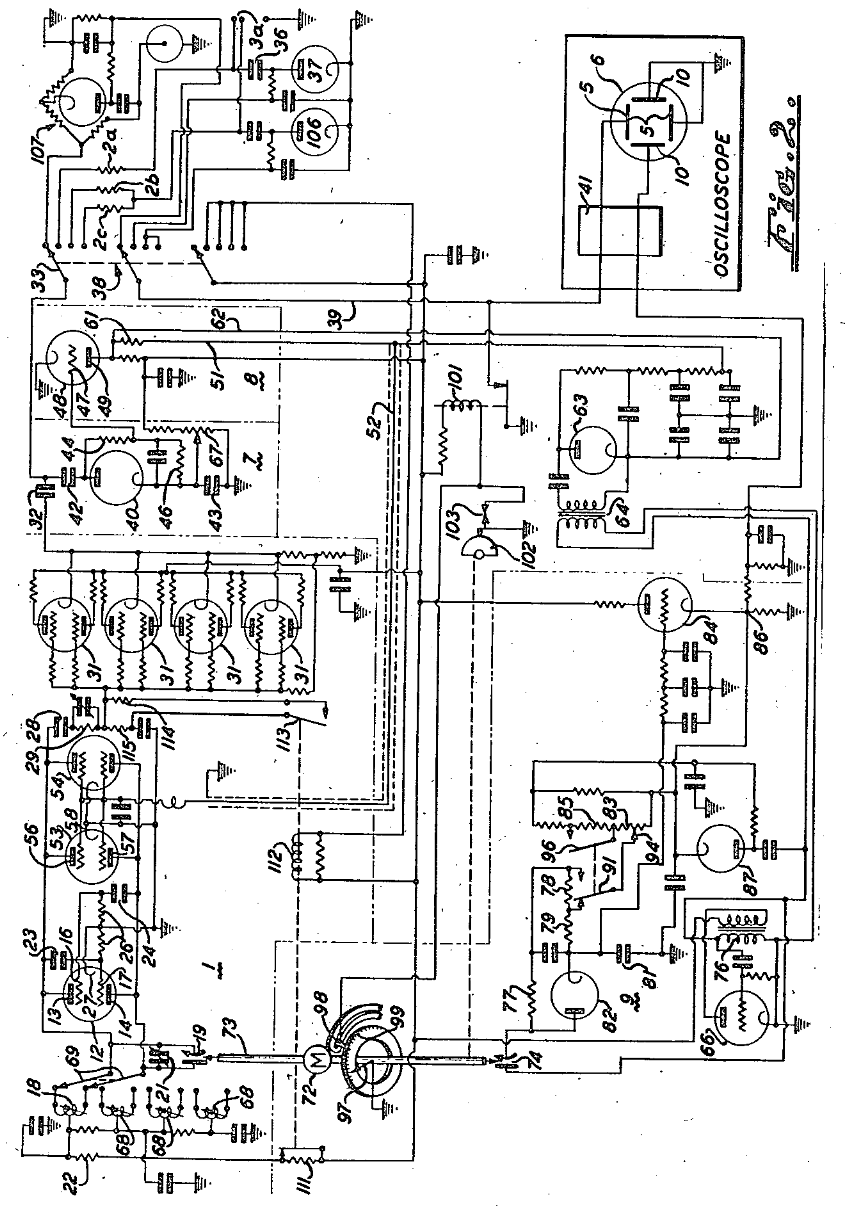
Fig. 2 is a complete circuit diagram illustrating the system.

Referring to Fig. 2, the oscillator 1 is of push-pull type, and consists of a pair of tubes embodied in a single envelope 12, each tube having a plate 13 and 14, respectively, and a control grid 16 and 17, respectively. Between the plates 13 and 14 is connected a suitable parallel resonant circuit consisting of an inductance 18 and a variable capacitor 19. A trimming capacitor 21 is also included for fixed adjustment. Plate voltage is supplied to the oscillator tubes by tapping the midpoint of the inductance 18 to a source of high voltage B+ through a plate load resistor 22. The oscillator is connected in push-pull fashion by the provision of coupling capacitors 23 and 24, the former coupling the grid 17 to the plate 13, and the latter coupling the grid 16 to the plate 14.

Grid leak resistors 26 tie each grid to the common cathode 27 of the two tubes.

Oscillator output is applied thru a capacitor 28 and resistor 29 to the respective grids of eight cathode followers, connected in parallel and embodied in four envelopes 31. Use of the eight parallel connected cathode followers results in a very low output impedance for the oscillation generator.

Through a coupling capacitor 32, the common output of the several cathode followers 31 is connected to the movable arm 33 of a multiposition switch 38, three of the contacts of which are connected respectively to the resistors 2*a*, 2*b*, and 2*c*. These three resistors represent three different impedance ranges which may be measured with the instrument. Each is connected to an output terminal; for example, the impedance 2*a* is connected to an output terminal 3*a* to which the unknown impedance to be observed may be connected. Each of the resistors 2*a*, 2*b*, and 2*c* is of magnitude many times larger than the highest impedance to which it will be connected, so that the current through the unknown impedance will be substantially constant, regardless of its value. Thus the voltage developed across the impedance will be a direct measure of the magnitude of the impedance itself.

The voltage at the terminal 3*a* is applied through a coupling capacitor 36 to a rectifier 37. The unidirectional voltage across the rectifier is applied through another layer of the switch 38 to a conductor 39 which energizes the vertical plates 5 of a cathode ray oscilloscope 6. A direct current amplifier 41 is preferably interposed to amplify the rectified signal taken from the rectifier 37.

In order that the current through the unknown impedance be substantially constant, it is essential that the output from the oscillation generator be substantially constant in amplitude, regardless of the varying frequencies through which the oscillator is swept by the sweeping of the tuning condenser 19. To this end a portion of the output voltage from the oscillation generator is applied to a rectifier 40 through coupling capacitors 42 and 43. The rectifier 40 is shunted by resistors 44 and 46, to the joint connection of which is connected the grid 47 of a control amplifier tube 48. By virtue of the operation of the rectifier 40, there is thus applied to the grid 47 a negative potential which is proportional in magnitude to the amplitude of the oscillator output appearing at the switch arm 33. This potential is amplified in the tube 48, and appears on its plates 49 as a control potential that is applied through the conductors 51 and 52 to the control grids of four tubes contained in two envelopes 53 and 54.

The tubes 53 and 54 are connected to constitute a variable impedance load between the two oscillator plates 13 and 14, and also across the oscillator tuned circuits 18—19. Since the tubes 53 and 54 are connected strictly in parallel, their functions are cumulative, so the operation of the tube 53 alone will be described. The two plates 56 and 57 of the tube 53, which are served by a common cathode 58, are connected respectively to the plates 13 and 14 of the oscillator tube 12. The cathode 58 is grounded, as is the oscillator cathode 27, so that the tube 53 constitutes a balanced variable load on the push-pull oscillator 12. It will be noted that the tube 53 also constitutes, by virtue of its variable conductivity, a variable impedance connected across the oscillator tuned circuit 18—19, the magnitude of the impedance serving to control the Q of the circuit. Since the Q of the oscillator tuned circuit directly controls the oscillator output, it is readily seen that the control tube 53, the grids of which are controlled from a voltage which is a function of the oscillator output, serves to maintain the oscillator output substantially constant.

For example, assume that the oscillator output drops slightly, so that the signal applied to the control rectifier 40 through the cathode followers 31 decreases. This causes corresponding decrease in the voltage across the resistor 46, which, since it is a negative bias, results in less negative voltage at the grid 47, thereby tending to lower the voltage at the plate 49. This lowered voltage is impressed through the conductors 51 and 52 upon the grid of the tubes 53 and 54, thereby decreasing their conductivity, raising the Q of the resonant circuit 18—19, and hence tending to increase the oscillator output amplitude. In this way any tendency for the oscillator output to change is resisted by a compensating voltage applied to the control tubes 53 and 54 from the control amplifier 48.

The control tubes 53 and 54 also tend to alter the D. C. anode voltage of the oscillator by virtue of the altered B+ current drawn through the resistor 22. This has the same effect as controlling the Q. The degree of control exercised by the tubes 53 and 54 is thus made cumulative.

To control the operating level of the grid of the tubes 53 and 54, a relatively constant, floating bias is injected into the feedback circuit by the resistor 61, across which the bias is developed by means of conductors 62 from a bias rectifier 63 fed from any suitable alternating source of power, such as a transformer 64. The transformer 64 is in turn energized from the sweep oscillator 66, to be described hereinafter, although any suitable source of alternating current may be employed if desired.

In similar manner the operating level for the control amplifier tube 48 is determined by means of an adjustable bias resistor 67, connected in potentiometer fashion between B+ and ground.

The oscillator tube 12 is designed for operation over four discrete frequency bands, which preferably overlap, by the provision of different inductances 68, which may be selectively substituted for the inductance 18 by any suitable switching means such as the switch 69.

Sweep means are provided for varying the frequency of the oscillator 12 back and forth, and synchronously applying a horizontal sweep voltage to the horizontal deflection plate 10 of the oscilloscope 6. This means comprises a motor 72 that drives a shaft 73 connected to the variable capacitor 19, which determines the oscillating frequency of the oscillator 1.

Shaft 73 also actuates a variable capacitor 74, connected in a sweep circuit to be now described. The capacitor 74 is in a series connected circuit which includes the transformer winding 76 connected to ground, the capacitor 74, the resistors 77, 78, and 79, and a capacitor 81. A rectifier 82 shunts the series connected resistors 77, 78 and 79, so that there appears across these resistors a unidirectional potential, proportional in magnitude to the amplitude of the A. C. current flowing through the series connected circuit just described. The transformer winding 76 forms part of the oscillating circuit of the oscillator tube 66, so that a substantially constant A. C. voltage is induced in the winding 76. The A. C. current through the circuit fed by the winding 76 is caused to vary in amplitude back and forth by the variation in capacitance of the capacitor 74 induced by the motion of the shaft 73. There is thus developed across the resistors 78 and 79 a unidirectional voltage which varies up and down in amplitude in synchronism with the back and forth sweep in frequency of the oscillator 1, induced by the sweeping of the variable capacitor 19.

A floating, unidirectional bias, developed across a potentiometer 83, is placed in the grid circuit of a sweep amplifier 84, in series with the sweeping voltage developed across the resistors 78 and 79. This voltage is applied to the grid of the tube 84, and appears amplified at the terminal 86, from which it is applied to the horizontal plates 10 of the oscilloscope 6, through a conventional direct current amplifier 41. The unidirectional biasing voltage across the potentiometer 83 is produced by rectifying the voltage developed in the transformer winding 76 in a rectifier 87.

Figure 3:
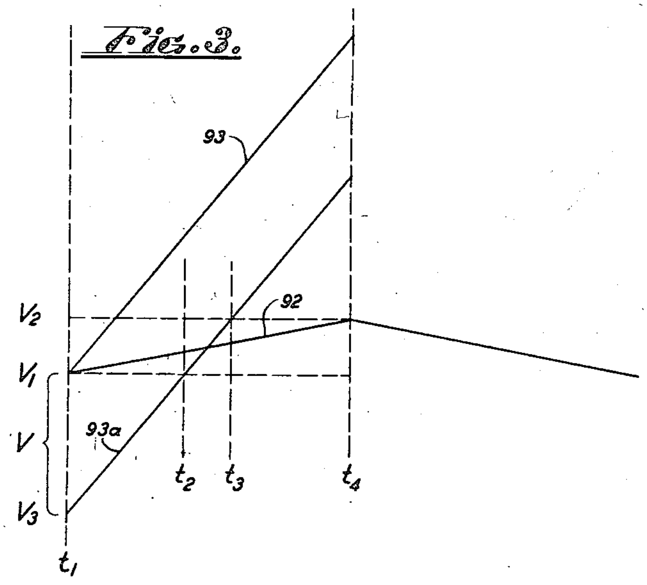
Fig. 3 is a graph illustrating operation of the sweep circuit.

In many instances, it is desirable to expand a pre-selected portion of the horizontal sweep and eliminate the rest, so that a particular region of the frequency spectrum may be more closely observed. To this end, means are provided for applying useful sweep voltage to the horizontal plates 10 during only a portion of the complete sweep cycle, as determined by the motor 72. This expanded sweep cycle traverses the scope screen much more rapidly than the normal sweep, so that an expanded picture of a pre-selected portion of the frequency spectrum is seen on the screen. The sweep circuit which applies sweep voltage to the plates 10 includes a two-position switch 91, which in its left hand position inserts only the voltage developed across resistor 79 into the grid energizing circuit of the sweep amplifier 84. In the right hand position of switch 91 the full voltage developed across both the resistor 78 and the resistor 79 is applied to the sweep amplifier 84. When the complete frequency spectrum is to be presented on the oscilloscope screen, the switch 91 is moved to the left hand position, so that only a portion of the complete sweep voltage, i. e. that developed across the resistor 79, is applied to the horizontal plates 10. This may be represented by the graph line 92 of Fig. 3. For purposes of explanation it will be assumed that the cathode ray spot is visible on the screen only when the horizontal deflection voltage lies between the values V1 and V2 shown on Fig. 3. If the voltage is below V1, the tube 84 does not conduct, and the potential at 86 is substantially zero. The spot on the cathode ray tube 6 is therefore in its zero position at the left of the screen. When the voltage V is above V2, the spot will move off the screen to the right. From Fig. 3, it will be seen that since the line 92 starts at V1 and ends at V2, the entire frequency spectrum will be presented when the resistor 79 alone is in the sweep circuit.

When the switch 91 is in its right hand position, the voltage applied to the sweep circuit (represented by the graph 92) will be several times that represented by the graph 92. A bias V is then inserted into the sweep circuit by means of the potentiometer 83, so that the starting point for the sweep is lowered to the value V3. From Fig. 3 it will be seen that when both resistors 78 and 79 are in the circuit, the sweep must progress from the time *t*1 to the time *t*2 before the biased sweep voltage 93*a* has risen to the value V1, when the spot first appears on the oscilloscope screen. It then rises rapidly to the value V2 and leaves the screen at the time *t*3. Hence, between the time *t*3 and the time *t*4, which is the end of a positive sweep cycle, the spot is off the screen and no trace appears. It will thus be seen that only that portion of the frequency spectrum which is being swept by the variable capacitor 19 between the times *t*2 and *t*3 will be observed on the oscilloscope 6. Any desired segment of the entire frequency spectrum may be observed by varying V through movement of the slider 94 of the potentiometer 83. Since a greater negative bias is required for the expanded sweep than for the normal sweep, a short circuiting switch 96 is ganged with the switch 91, so that when the latter is thrown to the right, the central portion of the voltage divider 85 is automatically shunted out, thereby applying increased negative bias to the grid of the sweep circuit amplifier 84.

For calibration purposes a frequency marker is provided in the form of an arm 97 rotated by the shaft 73, which contacts contact 98 adjustable around an arcuate scale 99. The members 97 and 98 are in the energizing circuit of a relay 101, which serves when energized to short circuit the input to the vertical plates 5 of the oscilloscope 6. With the contact 98 set at a predetermined reading on the scale 99, the observer knows that the sharp vertical dip appearing on the scope, as a result of the momentary shorting of the vertical deflection plates, is at the particular frequency indicated on the scale 99.

In order that a zero base line may appear on the oscilloscope screen, a semi-circular cam 102, driven also by the shaft 73, serves to short circuit the vertical deflection during each return sweep of the variable capacitor 19. In this way an absolute zero is provided for the benefit of the observer. The semi-circular cam 102 actuates contacts 103 which, like the contacts 97 and 98, energize the relay 101 to short out the vertical deflection during the period when the contacts are closed.

For measurement of impedances in the medium range the ganged switch 38 is placed in the third position from the top, thereby substituting the series resistor 2*b* for resistor 2*a*, the voltage developed across $Z_x$ being rectified in the rectifier 106. For low impedances the switch 38 is placed in the fourth position from the top, and the resistor 2*c* is employed, the resulting voltage being likewise rectified at 106.

While use of the impedance measuring circuit described hereinbefore shows the magnitude of an unknown impedance, no intimation is given of its phase angle. To determine this latter, it is possible to terminate the circuit with the unknown impedance, and then measure the standing wave ratio. For this purpose a bridge circuit 107 is employed with the unknown impedance constituting one arm of the bridge. Such a circuit and method are known in the art, being described in an article entitled "New high frequency bridge," by H. R. Whaley, in a publication entitled "Oscillator" of October 1946, published by the Western Electric Company. With the insertion of the bridge circuit 107 into the system, the vertical deflection of the oscilloscope 6 is a direct measure of the reflection coefficient A, which in turn is a determinant of the standing wave ratio. Given the standing wave ratio, it is possible by known methods to determine the resistive and reactive components of the unknown impedance $Z_x$. The bridge circuit 107, as seen in Fig. 2, is placed in the system by operating the ganged switch 38 to the upper of its several positions. When using the bridge circuit 107 it is preferred to have a lower output from the oscillator 1. This is achieved by inserting a resistor 111 into the anode energizing circuit of the oscillator 1 by operation of a relay 112. The relay also serves through its contacts 113 to place an additional resistance 114 in parallel with the normal oscillator output resistor 115, thereby also lowering the oscillator output.

*Operation*

The operation of the circuit of Fig. 2 will now be described.

The motor 72 sweeps the capacitance of capacitor 19 back and forth, thereby sweeping the frequency of the oscillator 1 back and forth between predetermined limits. The variable frequency output signal of the oscillator 1 appearing at the arm 33 of the switch 38 is maintained substantially constant in amplitude by means of the control tubes 53 and 54, actuated in response to the control amplifier 48. The oscillator output signal is applied through the resistor 2*a* to the terminal 3*a* and thence to the unknown impedance $Z_x$. The resistor 2*a* being many times larger than the unknown impedance, the current through the latter is substantially constant, so that the voltage developed thereacross is a substantially accurate measure of the magnitude of the impedance. This voltage is rectified at 37, and is applied to the vertical deflection plates 5 of the oscilloscope 6, through the D. C. amplifier 41.

Simultaneously with the sweeping of the capacitor 19 the motor 72 also sweeps the capacitor 74 back and forth, thereby varying the amplitude of alternating current through the sweep circuit, which includes the elements 76, 74, 77, 78, 79, and 81. The A. C. current is rectified in the rectifier 82, so that a unidirectional potential is developed across the resistors 78 and 79, which varies up and down in magnitude in synchronism with the frequency sweeping achieved by the variable capacitor 19 of the oscillator 1. This unidirectional sweep voltage is amplified at 84 and 41, and applied to the horizontal deflection plates of the oscilloscope 6. There is thus presented a plot on the screen of the oscilloscope 6 which indicates impedance versus frequency.

Any predetermined portion of the frequency spectrum may be expanded and examined in detail by throwing the switch 91 to the right hand position, so that only a portion of the cycle is applied in accelerated manner to the horizontal plates.

Obviously many modifications and variations of the present invention are possible in the light of the above teachings. It is therefore to be understood that within the scope of the appended claims the invention may be practiced otherwise than as specifically described.

The invention described herein may be manufactured and used by or for the Government of the United States of America for governmental purposes without the payment of any royalties thereon or therefor.

What is claimed is:

1. A controllable amplitude push-pull oscillator comprising a pair of tubes each having a plate, cathode, and grid, a tunable resonant circuit connected to said plates, and variable impedance means connected to said plates in parallel with said circuit, whereby the Q of said circuit and hence the oscillation amplitude of the oscillator may be controlled in accordance with the magnitude of said impedance, said variable impedance means being connected to the cathodes of said tubes and constituting a balanced variable load on the tubes.

2. An oscillator in accordance with claim 1, wherein said variable impedance means comprises a pair of control tubes, the conductivity of each of which is variable in response to bias on a grid thereof.

3. A controllable amplitude, push-pull oscillator comprising a pair of tubes having their cathodes connected together, a tunable resonant circuit connected between the plates of said tubes and positioned immediately adjacent thereto, and balanced variable impedance means connected to said cathodes and between said plates, thereby to control the Q of said circuit and hence the oscillation amplitude of the oscillator.

4. An oscillator in accordance with claim 3 wherein said variable impedance means comprises a pair of control tubes, the conductivity of each of which is variable in response to bias on a grid thereof, said control tubes having the plates thereof connected respectively to the plates of the oscillator tubes and having the cathodes thereof connected to the cathodes of the oscillator tubes.

5. A constant amplitude oscillation generator comprising a pair of tubes connected to form a push-pull oscillator having a tunable resonant current connected between the plates of the tubes, balanced tube means connected in parallel with said circuit, the conductivity of said tube means being variable, thereby to control the Q of said circuit and hence the oscillation amplitude of said oscillator, and circuit means connected between said oscillator and said tube means effective to control the conductivity of said tube means in response to output signal from said oscillator, said circuit means including rectifying means and amplifying means.

6. A constant amplitude oscillation generator comprising a pair of tubes connected to form a push-pull oscillator, the plates of said tubes being connected thru a tunable resonant circuit, a pair of control tubes connected respectively between said plates and the cathodes of said tubes, the conductivity of said control tubes being variable to control the Q of said circuit and hence control the oscillator output voltage, and circuit means connected between said oscillator and the grids of said control tubes effective to control the conductivity of said control tubes in response to oscillation amplitude of said oscillator, said means including a rectifier and an amplifier.

7. A controllable amplitude oscillator comprising a tube, a source of D. C. voltage for operating the tube, a resonant circuit interposed between said source and the plate of said tube for controlling the frequency of the A. C. oscillations of the tube, a variable impedance load connected between the plate and the cathode of the tube, and means interposed between said source and said circuit and responsive to a change in the D. C. current drawn from said source in response to a change in said load impedance for changing the D. C. voltage at the plate of the tube thereby to control the amplitude of said oscillations.

8. An oscillator in accordance with claim 7 wherein said means comprises a resistor.

9. A controllable amplitude, push-pull oscillator comprising a pair of tubes, a tunable resonant circuit connected between the plates of said tubes, a source of D. C. operating voltage, a balanced variable impedance load shunted across said tubes, said impedance load being variable to change the Q of said circuit and hence control the amplitude of the oscillator output voltage, and means interposed between said source and said circuit for changing the D. C. voltage at said plates in response to a change in the impedance of said balanced load thereby to control said output voltage cumulatively with said change in Q.

10. A controllable amplitude, push-pull oscillator comprising a pair of tubes having a common cathode, a tunable resonant circuit connected between the plates of said tubes, a pair of control tubes having a common cathode and connected respectively between the plates and said cathode of said first named tubes, the conductivity of said control tubes being variable to change the Q of said circuit and hence control the amplitude of the oscillator output voltage, a source of D. C. operating voltage, means interposed between said source and said circuit for changing the D. C. voltage at said plates in response to a change in the conductivity of said control tubes thereby to control said output voltage cumulatively with said change in Q, and circuit means connected between the output of said oscillator and the grids of said control tubes and effective to change the conductivity of said control tubes in response to variations in the amplitude of oscillation of said output voltage.

References Cited in the file of this patent

UNITED STATES PATENTS

| | | |
|---|---|---|
| 2,333,760 | Babo | Nov. 9, 1943 |
| 2,442,138 | Mann et al. | May 25, 1948 |
| 2,451,021 | Detuno | Oct. 21, 1948 |
| 2,453,529 | Mittelmann | Nov. 9, 1948 |
| 2,512,658 | Levy | June 27, 1950 |
| 2,543,030 | King | Feb. 27, 1951 |